United States Patent [19]

Fattaruso

[11] Patent Number: 6,150,884
[45] Date of Patent: Nov. 21, 2000

[54] MULTISTAGE AMPLIFIER CIRCUIT WITH IMPROVED NESTED TRANSCONDUCTANCE CAPACITANCE COMPENSATION

[75] Inventor: John W. Fattaruso, Dallas, Tex.

[73] Assignee: Texas Instruments Incorporated, Dallas, Tex.

[21] Appl. No.: 09/310,260

[22] Filed: May 12, 1999

Related U.S. Application Data

[60] Provisional application No. 60/085,359, May 13, 1998.

[51] Int. Cl.[7] .................................................. H03F 3/45
[52] U.S. Cl. .......................................... 330/257; 330/292
[58] Field of Search .................................. 330/252, 253, 330/255, 257, 292

[56] References Cited

U.S. PATENT DOCUMENTS

| | | | |
|---|---|---|---|
| 5,175,879 | 12/1992 | Ellingson et al. | 455/126 |
| 5,412,344 | 5/1995 | Franck | 330/255 |
| 5,486,790 | 1/1996 | Huijsing et al. | 330/260 |
| 5,670,910 | 9/1997 | Kato | 330/253 |
| 5,966,050 | 10/1999 | Yoshino et al. | 330/255 |

OTHER PUBLICATIONS

An Operational Amplifier with Multipath Miler Zero Cancellation for RHP Zero Removal; Rudd G.H. Eschauzier et al.; Delft University of Technology, pp. 122–125.
A Programmable 1.5V CMOS Class A–B Operational Amplifier with Hybrid Nested Miller Compensation for 120 db Gain and 6 MHz UGF; Eschauzier et al.; IEEE Transactionsof Solid State Circuits, vol. 29, No. 12, Dec. 12, 1994; pp. 1497–1504.
A 100–MHz 100–dB Operational Amplifier with Multipath Nested Miller Compensation Structure; Eschauzier et al.; IEEE Journal of Solid State Circuits, vol. 27, No. 12, Dec. 1992; pp. 1709–1717.
A CMOS Large–Swing Low–Distortion Three–Stage AB Power Amplifier; IEEE Journal of Solid State Circuits, vol. 25, No. 1, Feb. 1990; Opt Enyde et al.; pp. 265–273.
Opamp Compensation for Low–Voltage, Mixed–Signal Designs; Fattaruso; 1998 ISSCC Analog Tutorial; pp. 2–8.
Multistage Amplifier Topologies with Nested $G_m$–C Compensation; You et al.; IEEE Journal of Solid–State Circuits, vol. 32, No. 12, Dec. 1997; p. 2000–2011.
A CMOS Low–Distortion Fully Differential Power Amplifier with Double Nested Miller Compensation; Pernici et al.; IEEE Journal of Solid–State Circuits, vol. 28, No. 7, Jul. 1993; pp. 758–763.
A Multistage Amplifier Topology with Nested Gm–C Compensation for Low–Voltage Application; 1997 IEEE Solid–State Circuits Conference; pp. 348–349.

*Primary Examiner*—Steven J. Mottola
*Attorney, Agent, or Firm*—April M. Mosby; W. James Brady; Frederick J. Telecky, Jr.

[57] ABSTRACT

Inclusion of a current mirror circuit and differential amplifier in the input amplifier stage 10 and a current mirror circuit in the feed-forward amplifier stage 12 of the nested transconductance capacitance compensation multistage amplifier design provides a low-voltage multistage amplifier having less sensitivity to power supply voltage while retaining frequency domain advantages. The nested transconductance capacitance compensation multistage amplifier includes an input differential amplifier stage 10, a feed-forward amplifier stage 12, and an output amplifier stage 14. This design improves the power supply rejection of the multistage operational amplifier.

13 Claims, 4 Drawing Sheets

MULTISTAGE AMPLIFIER CIRCUIT WITH IMPROVED NESTED TRANSCONDUCTANCE CAPACITANCE COMPENSATION

This application claims priority under 35 USC § 119(e)(1) of provisional application Ser. No. 60/085,359, filed May 13, 1998.

BACKGROUND OF THE INVENTION

1. Field of the Invention

This invention relates generally to multistage operational amplifier circuit and, particularly, relates to improved operational amplifier circuits with nested transconductance capacitance compensation.

2. Description of the Related Art

As Very Large Scale Integrated (VLSI) circuits, such as Digital Signal Processing (DSP) systems, become more complex, it is incumbent upon the circuit designer to replace as many analog circuit blocks with digital ones. Some analog circuit blocks, particularly those interfacing external circuitry, however, cannot be replaced; such as, power amplifiers and output buffers. Accordingly, as the power supply constraints of DSP systems decrease, the level of power supply requirements of the associated analog interface circuits decreases as well.

General requirements in VLSI circuit designs are low distortion, small die size, and low quiescent current. However, it is difficult to satisfy all these requirements, especially regarding distortion, using previous design methodologies as the upper bound of the power supply voltage decreases.

Particularly, in cellular phone technology, a DSP solution integrates a digital base band chip with analog integration blocks, such as, analog to digital circuitry, digital to analog circuitry or filters. These analog integration blocks which interface external circuitry with the digital blocks are typically implemented using operational amplifiers. In order to extend the life of the battery in the cellular phone system and, ultimately, give the consumer longer talk time, designs include a decreased upper bound of the power supply voltage to 1.5V. Accordingly, all the components within the cellular phone system must not exceed this 1.5V power constraint. Presently, the combination of digital and analog circuit components exceeds this particular power constraint. Specifically, in light of the power consumption of digital circuitry, there are no known low-voltage operational amplifiers operable under this particular power constraint. There remains is a need for a low-power operational amplifier operable under the given system requirement.

Therefore, there is a need to provide an approach for nested transconductance capacitance compensation having less sensitivity to power supply voltage, while retaining frequency domain advantages.

SUMMARY OF THE INVENTION

An improved design for a low-voltage multistage amplifier having nested transconductance capacitance compensation which includes a current mirror circuit and a differential amplifier pair in a input differential amplifier stage and includes a current mirror circuit in a feed-forward stage improves the power supply rejection. This design provides a low-voltage multistage operational amplifier that has less sensitivity to power supply voltage while retaining frequency domain advantages.

An embodiment of a low-voltage multistage amplifier of the NGCC amplifier design according to the present invention includes a current mirror circuit and a differential amplifier pair in an input differential amplifier stage. In a feed-forward stage of the NGCC amplifier design, a current mirror circuit is coupled to a feed forward transistor device. Inclusion of current mirror circuits in both the input differential amplifier and feed-forward amplifier stages of the NGCC amplifier design will provide a low-voltage multistage amplifier of less sensitivity to power supply voltage while retaining frequency domain advantages.

Another embodiment of the present invention includes nested stages of the first embodiment. In this multistage operational amplifier, it is not necessary to allow subsequent stages to operate at supply voltages lower than a differential pair stage requires, since the first stage of an operational amplifier using NGCC disclosed in the prior art contains a differential pair to allow differential input voltages. The use of current mirror circuits including a differential pair in each of the elemental nested stages of the multistage operational amplifier exhibits higher power supply rejection.

BRIEF DESCRIPTION OF THE DRAWINGS

The features and advantages of the multistage operational amplifier with improved nested transconductance capacitance compensation according to the present invention will be more clearly understood from the following description taken in conjunction with the accompanying drawings in which.

DETAILED DESCRIPTION OF THE INVENTION

System requirements for operational amplifier analog circuit design necessitate high dc gain and low sensitivity to power supply voltage while retaining frequency domain advantages. The Miller technique is widely used for frequency compensation of operational amplifiers due to its stable operation under any condition. A disadvantage of the Miller technique, however, is that a zero appears in the right half of the complex s-plane which severely degrades the phase margin of the amplifier and, thus, the obtainable bandwidth and level of performance.

There are several modifications of the Miller technique to remove the Right Half Plane (RHP) zero. These modifications fundamentally limit the lowest supply voltage at which the amplifier circuit is able to operate and are no longer a suitable technique for removing the RHP zeros in Miller compensated operational amplifiers as the upper bound of the power supply voltage decreases. Cascoding may provide high gain; yet, the apparent trend towards lower threshold voltages of CMOS processes endangers the applicability of cascoded circuits.

Figure 1:
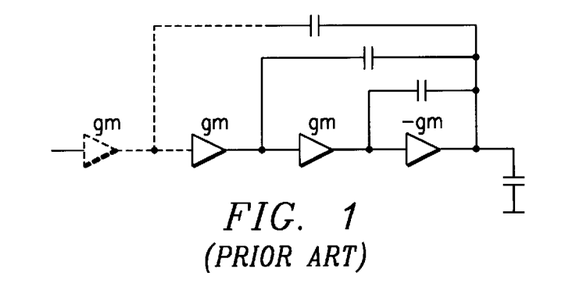
FIG. 1 is a block diagram of a known nested Miller compensation model.

Conventional designs include multiple cascaded stages having a simple inverting or noninverting amplifier to achieve high dc gain. To design this type of multistage operational amplifier with multiple feedback loops, special care must be taken to ensure stability. Conventional designs include Nested Miller compensation (NMC) as shown in FIG. 1, which is a well known compensation technique used to ensure stability in a multistage operational amplifiers with multiple feedback loops.

Figure 2:
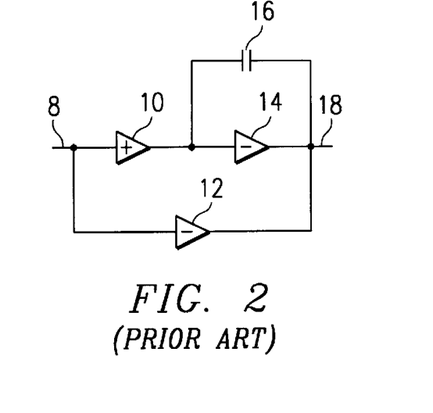
FIG. 2 is a block diagram of a known transconductance capacitance compensation nesting module.
Figure 3:
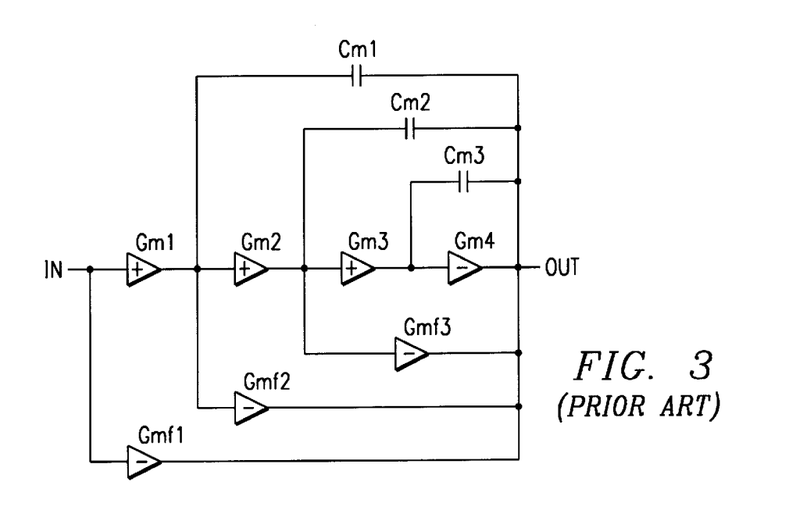
FIG. 3 is a block diagram of a known transconductance capacitance compensation four stage module design of FIG. 2.
Figure 5:
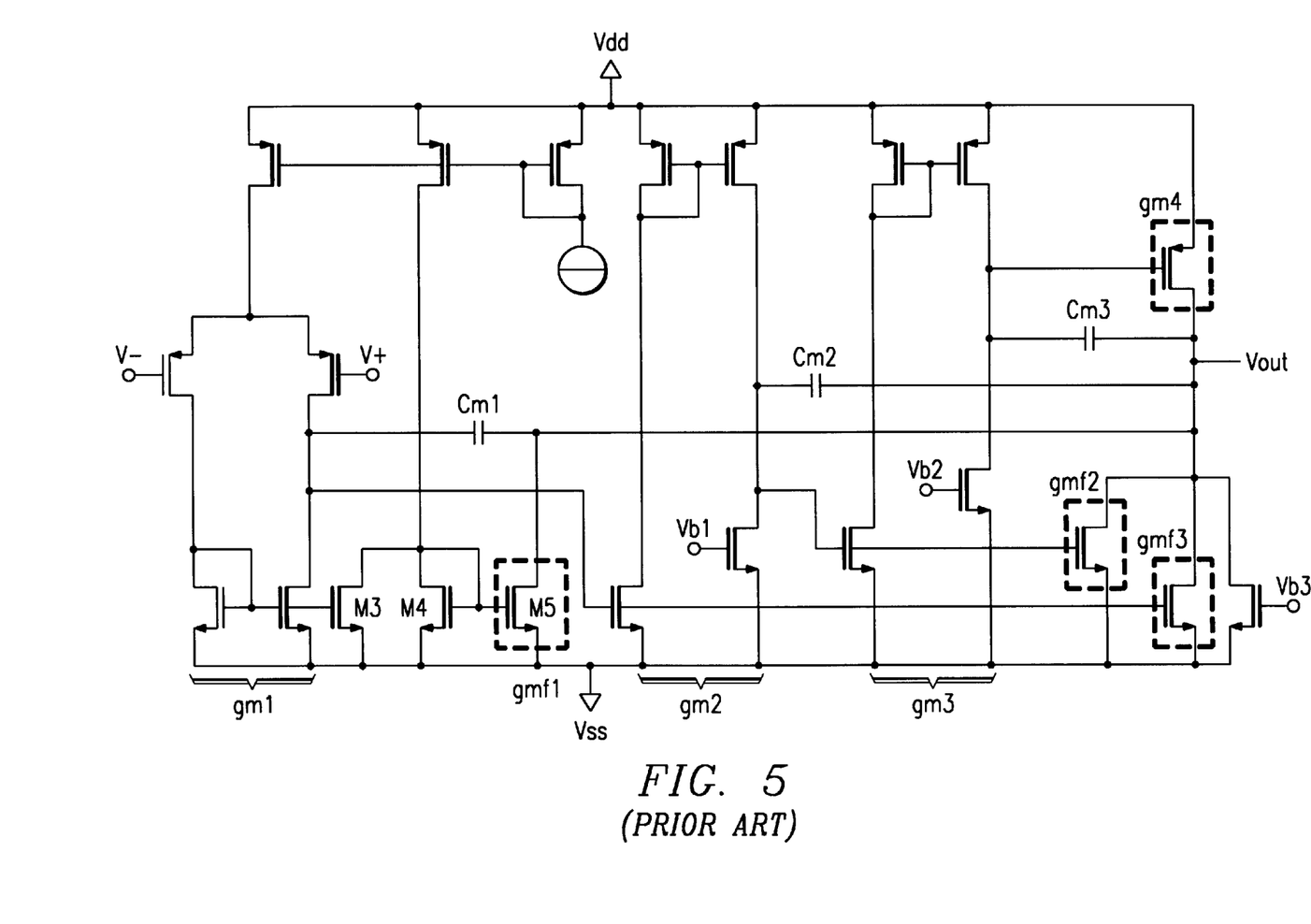
FIG. 5 is a schematic circuit diagram of a known four-stage nested transconductance capacitance compensation amplifier design of FIG. 3.

An alternative design to eliminate RHP zeros including nested transconductance capacitance compensation (NGCC) has a simple transfer function that yields stability conditions. As shown, FIG. 2 illustrates the conventional NGCC amplifier nesting module block diagram including an input terminal 8, an input differential stage 10, a feed-forward stage 12, an output amplifier stage 14 and a feedback element 16, an output terminal 18. This block diagram is described in 'A Multistage Amplifier Topology with Nested Gm-C Compensation for Low-Voltage Application', You, F et al., 1997 IEEE International Solid-State Circuits Conference, Session 21, Amplifiers, Paper SA 21.2. In particular, this reference discloses a multistage amplifier having a nested compensation scheme for low-voltage applications. Furthermore, FIG. 3 displays an 4-stage NGCC amplifier design having 2 nested modules, while FIG. 5 depicts the schematic represention of FIG. 3.

Figure 4:
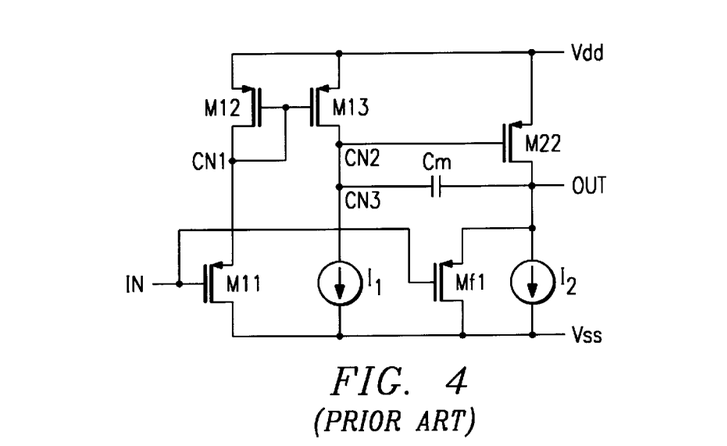
FIG. 4 is a schematic circuit diagram of a known nested transconductance capacitance compensation module design of FIG. 2.

FIG. 4 displays a schematic diagram of the block diagram of FIG. 2. This design has some advantages in greater stability and easier design procedure over other nested compensation schemes. Additionally, this circuit can be operated at very low supply levels; however, this multistage amplifier design is vulnerable to poor power supply rejection. This is due to the fact that as either VDD or VSS varies, the drain source voltage of n-channel enhancement type field effect transistor $M_{11}$ varies. The relatively high drain-source conductance of n-channel enhancement type field effect transistor $M_{11}$ will cause the current flowing into p-channel enhancement type field effect transistor $M_{12}$ which mirrors current from n-channel enhancement type field effect transistor $M_{11}$ to vary. This current variation is indistinguishable from variations that come from the input signal fed to the gate of n-channel enhancement type field effect transistor $M_{11}$ and constitute signal degradation.

Figure 6:
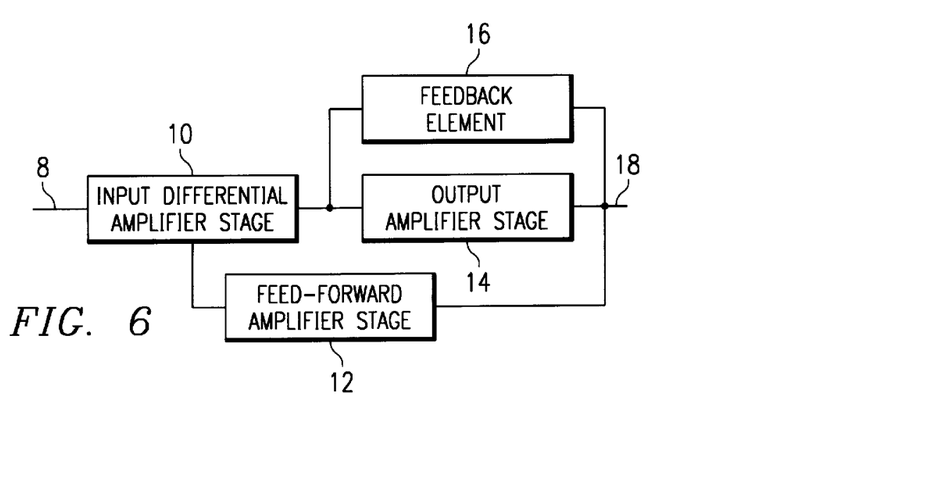
FIG. 6 is a block diagram of an embodiment of this invention.

FIG. 6 illustrates a block diagram of a first embodiment of the present invention including a multistage amplifier circuit 60 with an improved nested transconductance capacitance compensation design. A circuit which includes a plurality of nested amplifier modules connected in cascade shall be termed a ※multistage amplifier circuit ※ in this specification.

Circuit 60 depicts the input differential amplifier stage 10, having a differential amplifier pair and a current mirror circuit. This stage 10 connects to the input terminals 8 of the block diagram. The feed-forward amplifying stage 12, having a current mirror circuit, is coupled between the input differential amplifier stage 10 and the output terminal 18. The output amplifier stage 14 is coupled in between the input differential amplifier stage 10 and the output terminal 18. The feedback element 16 is coupled in parallel to the output amplifier stage 14 for stabilizing a signal traversing the cascaded amplifier circuit 60 by employing negative feedback. Thus, this design demonstrates a stable amplifier, eliminating the RHP zero.

Figure 7:
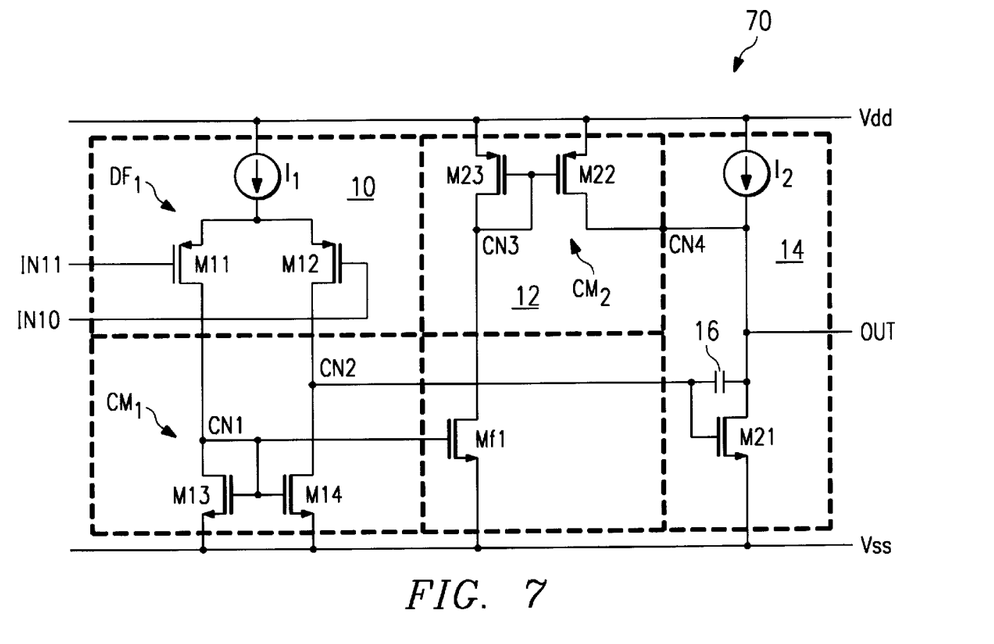
FIG. 7 is a schematic circuit diagram of an embodiment of this invention.

In FIG. 7, circuit 70 comprises an input differential amplifier stage 10, a feed-forward stage 12 and an output stage 14 including a feedback element 16 which are all coupled in parallel between two different power supply lines $V_{DD}$ and $V_{SS}$. A pair of input signals having opposite polarities to each other are coupled to the input nodes $IN_{10}$ and $IN_{11}$ of this multistage operational amplifier.

The input differential amplifier stage 10 includes a first differential circuit $DF_1$ and a first current mirror circuit $CM_1$ coupled in series between power supply lines $V_{DD}$ and $V_{SS}$. A first constant current source $I_1$ and a differential combination of a p-channel enhancement type field effect transistors $M_{11}$ and $M_{12}$ form in combination the first differential circuit $DF_1$, and the input nodes $IN_{10}$ and $IN_{11}$ are respectively connected to the gate electrodes of the p-channel enhancement type field effect transistors $M_{11}$ and $M_{12}$. The common source node of the p-channel enhancement type field effect transistors $M_{11}$ and $M_{12}$ is connected to the constant current source $I_1$ and current is supplied through the constant current source $I_1$ to the p-channel enhancement type field effect transistors $M_{11}$ and $M_{12}$. The drain nodes of the p-channel enhancement type field effect transistors $M_{11}$ and $M_{12}$ serve as current output nodes $CN_1$ and $CN_2$. The first constant current source $I_1$ regulates the total amount of current flowing into the p-channel enhancement type field effect transistors $M_{11}$ and $M_{12}$ and, accordingly, $I_1$ regulates the total amount of currents passing through the current output nodes $CN_1$ and $CN_2$ to a constant value. Therefore, the p-channel enhancement type field effect transistors $M_{11}$ and $M_{12}$ complementarily change the currents passing therethrough depending upon the potential difference between the input nodes $IN_{10}$ and $IN_{11}$.

The first current mirror circuit $CM_1$ is implemented by a pair of n-channel enhancement type field effect transistors $M_{13}$ and $M_{14}$ coupled between the first differential circuit $DF_1$ and the power supply line VSS. The gate electrodes of the n-channel enhancement type field effect transistors $M_{13}$ and $M_{14}$ are coupled to the current output node $CN_1$. Therefore, the potential level at the current output node $CN_1$ similarly affects the channel conductances of the n-channel enhancement type field effect transistors $M_{13}$ and $M_{14}$, concurrently changing the amount of current passing through either transistor. The n-channel enhancement type field effect transistors $M_{13}$ and $M_{14}$ perform a 'differential to single-ended' conversion, canceling any changes in the bias current of the differential pair $DF_1$ due to power supply voltage variation.

The feed-forward stage 12 includes a second current mirror circuit $CM_2$ and a n-channel enhancement type field effect transistor $M_{f1}$ coupled in series between power supply lines $V_{DD}$ and $V_{SS}$. The second current mirror circuit $CM_2$ is implemented by combination of p-channel enhancement type field effect transistors $M_{23}$ and $M_{22}$. The drain of n-channel enhancement type field effect transistor $M_{23}$ forms a current output node $CN_3$; while the drain of p-channel enhancement type field effect transistor $M_{22}$ forms the output node $OUT_{10}$. The current node $CN_3$ is coupled to the drain of the n-channel enhancement type field effect transistor $M_{f1}$. The gate electrode of the n-channel enhancement type field effect transistor $M_{f1}$ is coupled to the current output node $CN_1$, while the source of the n-channel enhancement type field effect transistor $M_{f1}$ is coupled to the power supply line $V_{SS}$. The potential level at the current output node $CN_3$ affects the channel conductances of the p-channel enhancement type field effect transistors $M_{23}$ and $M_{22}$ and concurrently changes the amount of current passing through the p-channel enhancement type field effect transistor $M_{23}$ and the amount of current passing through the p-channel enhancement type field effect transistor $M_{22}$.

The output stage 14 includes a n-channel enhancement type field effect transistor $M_{21}$, second constant current source $I_2$, and a feedback element 16. The second constant current source $I_2$ is coupled between power supply line $V_{DD}$ and the output node $OUT_{10}$. The feedback element 16 is coupled in parallel to the n-channel enhancement type field effect transistor $M_{21}$ across its drain and gate. This feedback element 16 includes a capacitor coupled between the current output node $CN_2$ and the output node $OUT_{10}$. The drain of the n-channel enhancement type field effect transistor $M_{21}$ is coupled to the output node $OUT_{10}$ and the source of the n-channel enhancement type field effect transistor $M_{21}$ is coupled to power supply line $V_{SS}$.

In order to ensure a polarity of transconductance of feed-forward stage 12 opposite to that of the input stage 10, the second current mirror circuit $CM_2$ mirrors the current from the feed-forward transistor n-channel enhancement type field effect transistor $M_{f1}$. Since the transconductance of n-channel enhancement type field effect transistor $M_{f1}$ is only half the sum of the transconductance of the n-channel enhancement type field effect transistors $M_{12}$ and $M_{14}$, the second current mirror circuit $CM_2$ must have a current gain of 2. In addition, the second current mirror circuit $CM_2$ supplies bias current for n-channel enhancement type field effect transistor $M_{21}$.

The value of each constant current sources, $I_1$ and $I_2$, affects the gain of each stage and are all assumed to be fixed by the designer and remain at or close to their design a value in the operation of the chip. To increase the number of stages in the multistage amplifier circuit, any additional input differential amplifier stages should include its own current source.

Figure 8:
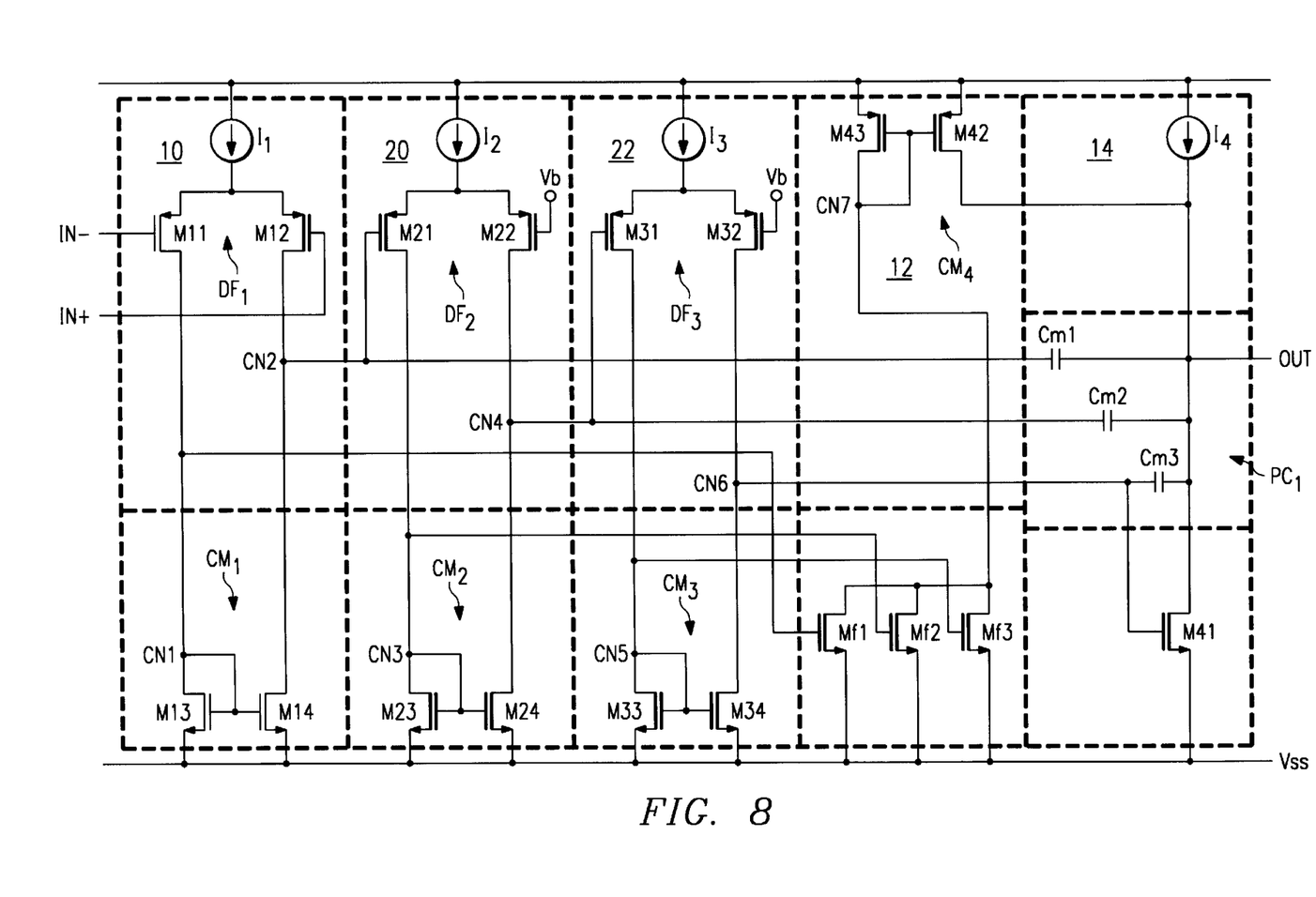
FIG. 8 is a schematic circuit diagram an alternative embodiment of this invention.

FIG. 8 displays a schematic circuit diagram of an alternative embodiment of the present invention, a four-stage operational amplifier 80 having the improved nested transconductance capacitance design. More particularly, FIG. 8 illustrates a schematic circuit diagram of the block diagram displayed in FIG. 3 which represents three differential pair stages followed by a fourth class-A output stage. Accordingly, the design includes a first 10, second 20, and third 22 input differential amplifier circuit, a feed-forward amplifier stage 12 and an output amplifier stage 14.

Similar to the input differential amplifier of FIG. 7, each input differential amplifier stage 10, 20, and 22 includes a diffential amplifier circuit and a current mirror circuit.

The input differential amplifier stage 10 includes a first differential circuit $DF_1$ and a first current mirror circuit $CM_1$ coupled in series between power supply lines $V_{DD}$ and $V_{SS}$. A first constant current source $I_1$ and a differential combination of a p-channel enhancement type field effect transistors $M_{11}$ and $M_{12}$ form in combination the first differential circuit $DF_1$, and the input nodes $IN_{10}$ and $IN_{11}$ are respectively connected to the gate electrodes of the p-channel enhancement type field effect transistors $M_{11}$ and $M_{12}$. The common source node of the p-channel enhancement type field effect transistors $M_{11}$ and $M_{12}$ is connected to the constant current source $I_1$ and current is supplied through the constant current source $I_1$ to the p-channel enhancement type field effect transistors $M_{11}$ and $M_{12}$. The drain nodes of the p-channel enhancement type field effect transistors $M_1$ and $M_{12}$ serve as current output nodes $CN_1$ and $CN_2$. The first constant current source $I_1$ regulates the total amount of current flowing into the p-channel enhancement type field effect transistors $M_{11}$ and $M_{12}$ and, accordingly, $I_1$ regulates the total amount of currents passing through the current output nodes $CN_1$ and $CN_2$ to a constant value. Therefore, the p-channel enhancement type field effect transistors $M_{11}$ and $M_{12}$ complementarily change the currents passing therethrough depending upon the potential difference between the input nodes $IN_{10}$ and $IN_{11}$.

The first current mirror circuit $CM_1$ is implemented by a pair of n-channel enhancement type field effect transistors $M_{13}$ and $M_{14}$ coupled between the first differential circuit $DF_1$ and the power supply line VSS. The gate electrodes of the n-channel enhancement type field effect transistors $M_{13}$ and $M_{14}$ are coupled to the current output node $CN_1$. Therefore, the potential level at the current output node $CN_1$ similarly affects the channel conductances of the n-channel enhancement type field effect transistors $M_{13}$ and $M_{14}$, concurrently changing the amount of current passing through either transistor. The n-channel enhancement type field effect transistors $M_{13}$ and $M_{14}$ perform a 'differential to single-ended' conversion, canceling any changes in the bias current of the differential pair $DF_1$ due to power supply voltage variation.

The second input differential amplifier stage 20 includes a second differential circuit $DF_2$ and a second current mirror circuit $CM_2$ coupled in series between power supply lines VDD and VSS. A second constant current source $I_2$ and a differential combination of a p-channel enhancement type field effect transistors $M_{21}$ and $M_{22}$ form in combination the first differential circuit $DF_2$, and the current output node $CN_2$ and power supply line Vb are respectively connected to the gate electrodes of the p-channel enhancement type field effect transistors $M_{21}$ and $M_{22}$. The common source node of the p-channel enhancement type field effect transistors $M_{21}$ and $M_{22}$ is connected to the constant current source $I_2$ and current is supplied through the constant current source $I_2$ to the p-channel enhancement type field effect transistors $M_{21}$ and $M_{22}$. The drain nodes of the p-channel enhancement type field effect transistors $M_{21}$ and $M_{22}$ serve as current output nodes $CN_3$ and $CN_4$. The second constant current source $I_2$ regulates the total amount of current flowing into the p-channel enhancement type field effect transistors $M_{21}$ and $M_{22}$ and, accordingly, $I_2$ regulates the total amount of currents passing through the current output nodes $CN_3$ and $CN_4$ to a constant value. Therefore, the p-channel enhancement type field effect transistors $M_{21}$ and $M_{22}$ complementarily change the currents passing therethrough depending upon the potential difference between the current output node $CN_1$ and power supply line Vb.

The second current mirror circuit $CM_2$ is implemented by a pair of n-channel enhancement type field effect transistors $M_{23}$ and $M_{24}$ coupled between the second differential circuit $DF_2$ and the power supply line VSS. The gate electrodes of the n-channel enhancement type field effect transistors $M_{23}$ and $M_{24}$ are coupled to the current output node $CN_3$. Therefore, the potential level at the current output node $CN_3$ similarly affects the channel conductances of the n-channel enhancement type field effect transistors $M_{23}$ and $M_{24}$ and concurrently changes the amount of current passing through the n-channel enhancement type field effect transistor $M_{23}$ and the amount of current passing through the n-channel enhancement type field effect transistor $M_{24}$. The n-channel enhancement type field effect transistors $M_{23}$ and $M_{24}$ perform a 'differential to single-ended' conversion, canceling any changes in the bias current of the differential pair $DF_2$ due to power supply voltage variation.

The third input differential amplifier stage 22 includes a third differential circuit $DF_3$ and a third current mirror circuit $CM_3$ coupled in series between power supply lines VDD and VSS. A third constant current source $I_3$ and a parallel combination of a p-channel enhancement type field effect transistors $M_{31}$ and $M_{32}$ form in combination the third differential circuit $DF_3$, and the current output node $CN_4$ and power supply line Vb are respectively connected to the gate electrodes of the p-channel enhancement type field effect transistors $M_{31}$ and $M_{32}$. The common source node of the p-channel enhancement type field effect transistors $M_{31}$ and $M_{32}$ is connected to the constant current source $I_3$ and current is supplied through the constant current source $I_3$ to the p-channel enhancement type field effect transistors $M_{31}$ and $M_{32}$. The drain nodes of the p-channel enhancement type field effect transistors $M_{31}$ and $M_{32}$ serve as current output nodes $CN_5$ and $CN_6$. The third constant current source $I_3$ regulates the total amount of current flowing into the p-channel enhancement type field effect transistors $M_{21}$ and $M_{22}$ and, accordingly, $I_3$ regulates the total amount of currents passing through the current output nodes $CN_5$ and $CN_6$ to a constant value. Therefore, the p-channel enhancement type field effect transistors $M_{31}$ and $M_{32}$ complementarily change the currents passing therethrough depending upon the potential difference between the current output node $CN_4$ and power supply line Vb.

The third current mirror circuit $CM_3$ is implemented by a pair of n-channel enhancement type field effect transistors $M_{23}$ and $M_{24}$ coupled between the first differential circuit $DF_3$ and the power supply line VSS. The gate electrodes of the n-channel enhancement type field effect transistors $M_{23}$ and $M_{24}$ are coupled to the current output node $CN_5$. Therefore, the potential level at the current output node $CN_5$ similarly affects the channel conductances of the n-channel enhancement type field effect transistors $M_{23}$ and $M_{24}$ and concurrently changes the amount of current passing through the n-channel enhancement type field effect transistor $M_{23}$ and the amount of current passing through the n-channel enhancement type field effect transistor $M_{24}$. The n-channel enhancement type field effect transistors $M_{23}$ and $M_{24}$ perform a 'differential to single-ended' conversion, canceling any changes in the bias current of the differential pair $DF_3$ due to power supply voltage variation.

The feed-forward stage 12 includes a fourth current mirror circuit $CM_4$ and three n-channel enhancement type field effect transistor $M_{f1}$, $M_{f2}$, and $M_{f3}$ coupled in series between power supply lines $V_{DD}$ and $V_{SS}$. The fourth current mirror circuit $CM_4$ is implemented by combination of p-channel enhancement type field effect transistors $M_{43}$ and $M_{42}$. The drain of p-channel enhancement type field effect transistor $M_{43}$ forms a current node $CN_7$, while the drain of p-channel enhancement type field effect transistor $M_{22}$ forms the output node $OUT_{10}$. The current node $CN_7$ is coupled to the source of each of the n-channel enhancement type field effect transistors $M_{f1}$, $M_{f2}$ and $M_{f3}$. The gate electrode of the n-channel enhancement type field effect transistor $M_{f1}$ is coupled to the current output node $CN_1$. The gate electrode of the n-channel enhancement type field effect transistor $M_{f2}$ is coupled to the current output node $CN_3$. The gate electrode of the n-channel enhancement type field effect transistor $M_{f3}$ is coupled to the current output node $CN_5$. Each source of the n-channel enhancement type field effect transistors $M_{f1}$, $M_{f2}$ and $M_{f3}$ are coupled to the power supply line $V_{SS}$. The potential level at the current output node $CN_7$ affects the channel conductances of the p-channel enhancement type field effect transistors $M_{43}$ and $M_{42}$ and concurrently changes the amount of current passing through the p-channel enhancement type field effect transistor $M_{43}$ and the amount of current passing through the p-channel enhancement type field effect transistor $M_{42}$.

Functionally, driven by the current from each of the three current mirror circuits, each of the transistors $M_{f1}$, $M_{f2}$ and $M_{f3}$ generate feed-forward transconductance for the first three stages, respectively. Their drain currents are summed and fed to the output through the fourth current mirror circuit formed by transistors $M_{43}$ and $M_{42}$. As in the embodiment of FIG. 6, this fourth current mirror circuit of the output differential amplifier stage must have a current gain of 2. Transistor $M_{42}$ supplies much of the DC bias current needed by output device $M_{41}$, which is a class-A realization of $G_{m4}$ in FIG. 3.

The output stage 14 includes a n-channel enhancement type field effect transistor $M_{41}$, fourth constant current source $I_4$, and a feedback module 16. The fourth constant current source $I_4$ is coupled between power supply line $V_{DD}$ and the output node $OUT_{10}$. The feedback module 16 includes three capacitors $Cm_1$, $Cm_2$ and $Cm_3$ coupled in parallel between the output node $OUT_{10}$ and current nodes $CN_2$, $CN_4$, and $CN_6$, respectively. Capacitor $Cm_3$ is coupled in parallel to the n-channel enhancement type field effect transistor $M_{41}$ across its drain and gate. The drain of the n-channel enhancement type field effect transistor $M_{41}$ is coupled to the output node $OUT_{10}$ and the source of the n-channel enhancement type field effect transistor $M_{41}$ is coupled to power supply line $V_{SS}$.

The value of each constant current sources, $I_1$, $I_2$, $I_{13}$ and $I_4$, affects the gain of each stage and are all assumed to be fixed by the designer and remain at or close to their design a value in the operation of the chip. To increase the number of stages in the multistage amplifier circuit, any additional input differential amplifier stages should include its own current source.

Alternate embodiments for FIGS. 7 and 8 may include bi-polar transistor devices as substitution for the enhancement type MOS field effect transistors. The collectors would be connected in place of the drains; the emitters in place of the sources; and the bases of the bi-polar transistors for the bases of the enhancement type MOS field effect transistors.

Another alternate embodiment of FIGS. 7 and 8 may include reversing the polarity of n-type and p-type devices implemented in the displayed circuits.

Further scope of applicability of the present invention should become apparent from the detailed description given above. However, it should be understood that the detailed description and specific examples, while indicating embodiments of the invention, are given by way of illustration only, since various changes and modifications within the spirit and scope of the invention should become apparent to those skilled in the art from this detailed description. Accordingly, this detailed description and specific examples are not to be considered as limiting the present invention.

I claim:

1. A multistage operational amplifier circuit comprising:
   A. at least one input differential amplifier stage including a first differential amplifier pair, a first current mirror circuit, a first constant current source, the first differential amplifier pair having a first and a second output node, the first differential amplifier pair coupled between the first constant current source and the first current mirror circuit;
   B. a feed-forward amplifier stage having a second current mirror circuit and at least one feed-forward transistor having a gate, a drain and a source, the second current mirror circuit having a third and a fourth output node, the second current mirror circuit coupled to the drain of the at least one feed-forward transistor, the gate of the at least one feed-forward transistor coupled to the first output node; and C. an output amplifier stage having a second constant current source, at least one feedback element and a transistor having a gate, a drain and a source, the second constant current source and the drain of the transistor coupled to the fourth output node, the at least one feedback element coupled between the second output node and the fourth output node, the gate of the transistor coupled to the second output node.

2. A multistage operational amplifier circuit having a pair of input nodes, an output node and a pair of power supply lines comprising:

A. a pair of input signals having opposite polarities coupled to the pair of input nodes;

B. at least one input differential amplifier stage including a first differential amplifier pair, a first current mirror circuit, a first constant current source,
   i. the first constant current source coupled to the first power supply line,
   ii. the differential amplifier pair having an inverting transistor and non-inverting transistor each having a respective gate, drain and source, the inverting and non-inverting transistors having respective source nodes coupled to the first constant current source, the gates of the inverting transistor and non-inverting transistor coupled to the pair of input nodes, the drain electrode of the non-inverting transistor coupled to a first current node, the drain electrode of the inverting transistor coupled to a second current node, and
   iii. the first current mirror circuit having a first and a second current mirror transistor each having a respective gate, drain and source, the drain of the first current mirror transistor coupled to the first current node, the drain of the second current mirror transistor coupled to the second current node the first and second current mirror transistors having respective gates coupled to the first current node, the first and second current mirror transistors having respective sources coupled to the second power supply line;

C. a feed-forward amplifier stage having a second current mirror circuit and at least one feed-forward transistor having a gate, drain and a source, the second current mirror circuit having a third and a fourth current mirror transistor each having a respective gate, drain and source, the drain of the third current mirror transistor coupled to a third current node the third and fourth current mirror transistors having respective gates coupled to the third current node, the third and fourth current mirror transistors having respective sources coupled to the first power supply line, the drain of the fourth current mirror transistor coupled to the output node, the drain of the feed-forward transistor coupled to the third current node, the gate of the feed-forward transistor coupled to the first current node, the source of the feed-forward transistor coupled to the second power supply line; and D. an output amplifier stage having a second constant current source, an inverting transistor, having a gate, a drain and a source, and at least one feedback element, the second current source coupled between the first power supply line and the output node, the drain of the inverting transistor coupled to the output node, the source of the inverting transistor coupled to the second power supply line, the gate of the inverting transistor coupled to the second current node, the at least one feedback element coupled between the second current node and the output node.

3. A multistage amplifier circuit of claim 2 wherein the plurality of transistors are a plurality bi-polar devices each having a collector, an emitter and base, each collector of each of the plurality of bi-polar devices connected in place of each drain of each of the plurality of transistors, each emitter of each of the plurality of bi-polar devices connected in place of each source of each of the transistor devices, each base of each of the plurality of bi-polar devices connected in place of each gate of each of the plurality of transistors.

4. The multistage amplifier circuit of claim 2 having a first, second and third power supply terminal in which the circuit has:

A. three input amplifier stages connected in parallel, the first input amplifier stage having a first differential amplifier pair having a first and a second output node, the second input amplifier stage having a second differential amplifier pair having a third and a fourth output node, the third input amplifier stage having a third differential amplifier pair having a fifth and a sixth output node;

B. the inputs of the second input amplifier stage are connected to the third power supply voltage terminal and the second current electrode of the second transistor of the first differential amplifier pair;

C. the inputs of the third input amplifier stage are connected to the third power supply voltage terminal and the second current electrode of the second transistor of the second differential amplifier pair;

D. three feed-forward transistors coupled to the three input amplifier stages, the control node of the first feed-forward transistor coupled to the first output node, the control node of the second feed-forward transistor coupled to the third output node and the control node of the third feed-forward transistor coupled to the fifth output node; and E. three feedback elements coupled to the output node, the the first feedback element coupled to the second output node, the feedback element coupled to the fourth output node and the third feedback element coupled to the sixth output node.

5. The multistage amplifier circuit of claim 4 wherein the plurality of transistors are a plurality bi-polar devices each having a collector, an emitter and base, each collector of each of the plurality of bi-polar devices connected in place of each drain of each of the plurality of transistors, each emitter of each of the plurality of bi-polar devices connected in place of each source of each of the transistor devices, each base of each of the plurality of bi-polar devices connected in place of each gate of each of the plurality of transistors.

6. The multistage operational amplifier circuit of claim 1, wherein differential amplifier pair of the input differential amplifier stage includes an inverting and non-inverting transistor having a gate, a drain and a source, the inverting and non-inverting transistors having respective source nodes coupled to the first constant current source, each gate of the inverting transistor and non-inverting transistor coupled to one of the pair of input nodes, the drain of the non-inverting transistor coupled to the first output node, the drain of the inverting transistor coupled to the second output node.

7. The multistage amplifier circuit of claim 6 wherein the plurality of transistors are a plurality bi-polar devices each having a collector, an emitter and base, each collector of each of the plurality of bi-polar devices connected in place of each drain of each of the plurality of transistors, each emitter of each of the plurality of bi-polar devices connected in place of each source of each of the transistor devices, each base of each of the plurality of bi-polar devices connected in place of each gate of each of the plurality of transistors.

8. The multistage operational amplifier circuit of claim 1, wherein current mirror circuit of the input differential amplifier stage includes a first and a second current mirror transistor having a gate, a drain and a source, the drain of the first current mirror transistor coupled to the first output node, the first and second current mirror transistors having respective gates coupled to the first output node, the drain of the second current mirror transistor coupled to the second otuput node.

9. The multistage amplifier circuit of claim 8 wherein the plurality of transistors are a plurality bi-polar devices each having a collector, an emitter and base, each collector of each of the plurality of bi-polar devices connected in place of each drain of each of the plurality of transistors, each emitter of each of the plurality of bi-polar devices connected in place of each source of each of the transistor devices, each base of each of the plurality of bi-polar devices connected in place of each gate of each of the plurality of transistors.

10. The multistage operational amplifier circuit of claim 1, wherein the second current mirror circuit of the feedforward amplifier stage includes a first and a second current mirror transistor having a gate, a drain and a source, the drain of the first current mirror transistor coupled to the third output node, the first and second current mirror transistors having respective gates coupled to the third output node, the drain of the second current mirror transistor coupled to the fourth output node.

11. The multistage amplifier circuit of claim 10 wherein the plurality of transistors are a plurality bi-polar devices each having a collector, an emitter and base, each collector of each of the plurality of bi-polar devices connected in place of each drain of each of the plurality of transistors, each emitter of each of the plurality of bi-polar devices connected in place of each source of each of the transistor devices, each base of each of the plurality of bi-polar devices connected in place of each gate of each of the plurality of transistors.

12. The multistage operational amplifier circuit of claim 1, wherein the feedback element is a capacitor.

13. The multistage amplifier circuit of claim 1 wherein the plurality of transistors are a plurality bi-polar devices each having a collector, an emitter and base, each collector of each of the plurality of bi-polar devices connected in place of each drain of each of the plurality of transistors, each emitter of each of the plurality of bi-polar devices connected in place of each source of each of the transistor devices, each base of each of the plurality of bi-polar devices connected in place of each gate of each of the plurality of transistors.

* * * * *